(12) United States Patent
Bair et al.

(10) Patent No.: US 7,213,122 B2
(45) Date of Patent: May 1, 2007

(54) CONTROLLING THE GENERATION AND SELECTION OF ADDRESSES TO BE USED IN A VERIFICATION ENVIRONMENT

(75) Inventors: Dean G. Bair, Bloomington, NY (US); Edward J. Kaminski, Jr., Wynnewood, PA (US); James L. Schafer, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 10/817,091

(22) Filed: Apr. 2, 2004

(65) Prior Publication Data

US 2005/0240817 A1    Oct. 27, 2005

(51) Int. Cl.
  *G06F 12/00*   (2006.01)
(52) U.S. Cl. ..................................... 711/200
(58) Field of Classification Search ................ 711/219, 711/200; 714/39, 25, 33; 703/14, 21; 716/6
See application file for complete search history.

(56) References Cited

U.S. PATENT DOCUMENTS

| | | | | |
|---|---|---|---|---|
| 3,794,813 A * | 2/1974 | Spetz | ........................ | 235/382 |
| 4,862,399 A * | 8/1989 | Freeman | ..................... | 714/738 |
| 5,029,171 A * | 7/1991 | Lee et al. | ................... | 714/744 |
| 5,444,717 A * | 8/1995 | Rotker et al. | ............... | 714/744 |
| 5,488,573 A * | 1/1996 | Brown et al. | ................. | 703/21 |
| 5,572,664 A * | 11/1996 | Bujanos | ...................... | 714/25 |
| 5,583,787 A * | 12/1996 | Underwood et al. | .......... | 716/6 |
| 5,708,774 A * | 1/1998 | Boden | ......................... | 714/38 |
| 5,724,504 A * | 3/1998 | Aharon et al. | ............... | 714/33 |
| 5,729,554 A * | 3/1998 | Weir et al. | .................. | 714/739 |
| 6,028,983 A | 2/2000 | Jaber | ..................... | 395/183.06 |
| 6,292,765 B1 * | 9/2001 | Ho et al. | ...................... | 703/14 |
| 6,298,429 B1 * | 10/2001 | Scott et al. | ................. | 711/219 |
| 6,539,477 B1 * | 3/2003 | Seawright | ................... | 713/100 |
| 7,024,258 B2 * | 4/2006 | Ahmed et al. | ................ | 700/86 |
| 2005/0010886 A1 * | 1/2005 | Urata et al. | .................... | 716/6 |

* cited by examiner

*Primary Examiner*—Pierre Bataille
*Assistant Examiner*—Paul Schlie
(74) *Attorney, Agent, or Firm*—Lynn Augspurger, Esq.; Kevin P. Radigan, Esq.; Heslin Rothenberg Farley & Mesiti, P.C.

(57) ABSTRACT

The generation and selection of addresses to be employed in a verification environment are tightly coupled to ensure that the addresses a user desires to be selected have been generated. Addresses are generated based on one or more defined selection attributes. The generated addresses are maintained in a database structure that also includes any attributes associated with the addresses. At least one address is selected from the database structure via a filter and forwarded to a component under test.

31 Claims, 10 Drawing Sheets

CONTROLLING THE GENERATION AND SELECTION OF ADDRESSES TO BE USED IN A VERIFICATION ENVIRONMENT

TECHNICAL FIELD

This invention relates, in general, to verifying components under test in a verification environment, and in particular, to controlling the generation and selection of addresses to be employed during verification of components under test.

BACKGROUND OF THE INVENTION

A component under test is typically a simulated component that has test scenarios applied thereto to verify whether the component is behaving as expected. The test scenarios are selected to stress the component to ensure that the component when stressed still acts appropriately. For example, if the component under test is a unit of memory, then test scenarios are applied against the unit of memory to verify that the data ultimately stored in the memory is the correct data.

One test scenario that is typically applied to a component under test is a scenario that causes stressful address conflicts. Addresses are provided to requestors and those requestors target the component under test using the provided addresses. The goal is to stress the component under test to verify how well the component responds.

The success of the test, however, depends on the addresses that are provided to the requesters. Previously, techniques have been employed to generate and select addresses to be used by the requesters. However, the generation and selection techniques have heretofore been disjoint causing the selection of addresses that did not meet the needs of the requesters. For example, stressful address conflicts were unable to be created or were difficult to create.

Thus, a need exists for an enhanced capability to generate and select addresses to be used in a verification environment. For example, a need exists for a capability that tightly couples the generation and selection of addresses.

SUMMARY OF THE INVENTION

The shortcomings of the prior art are overcome and additional advantages are provided through the provision of a method of providing addresses to be used in a verification environment. The method includes, for instance, generating one or more addresses having one or more attributes associated therewith, wherein the generating of at least one address of the one or more addresses is based on at least one selection attribute to be used in selecting at least one address of the one or more addresses; and selecting at least one address to be forwarded to a component under test in a verification environment from the one or more generated addresses, the selecting employing a filter specifying at least one selection attribute that corresponds to at least one attribute of the one or more attributes, wherein the generating and the selecting are controlled to ensure at least one address is selected that satisfies the filter.

System and computer program products corresponding to the above-summarized method are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

In accordance with an aspect of the present invention, a capability is provided to control the generation and selection of addresses to be employed in verifying components under test, such as electrical components of a simulated computing environment. As one example, address generation is tightly coupled with address selection to be able to specifically select a particular type of address to be forwarded to a component being verified in, for instance, a pseudo-random functional verification environment. Addresses are generated that have user defined attributes associated therewith and a particular generated address is selected based on a user defined filter. This capability may be used to verify many types of components in various systems, including systems based on the ESA/390 architecture offered by IBM®. (IBM® is a registered trademark of International Business Machines Corporation, Armonk, N.Y., U.S.A. ESA/390 and other names used herein may be registered trademarks, trademarks or product names of International Business Machines Corporation or other companies.)

Figure 1:
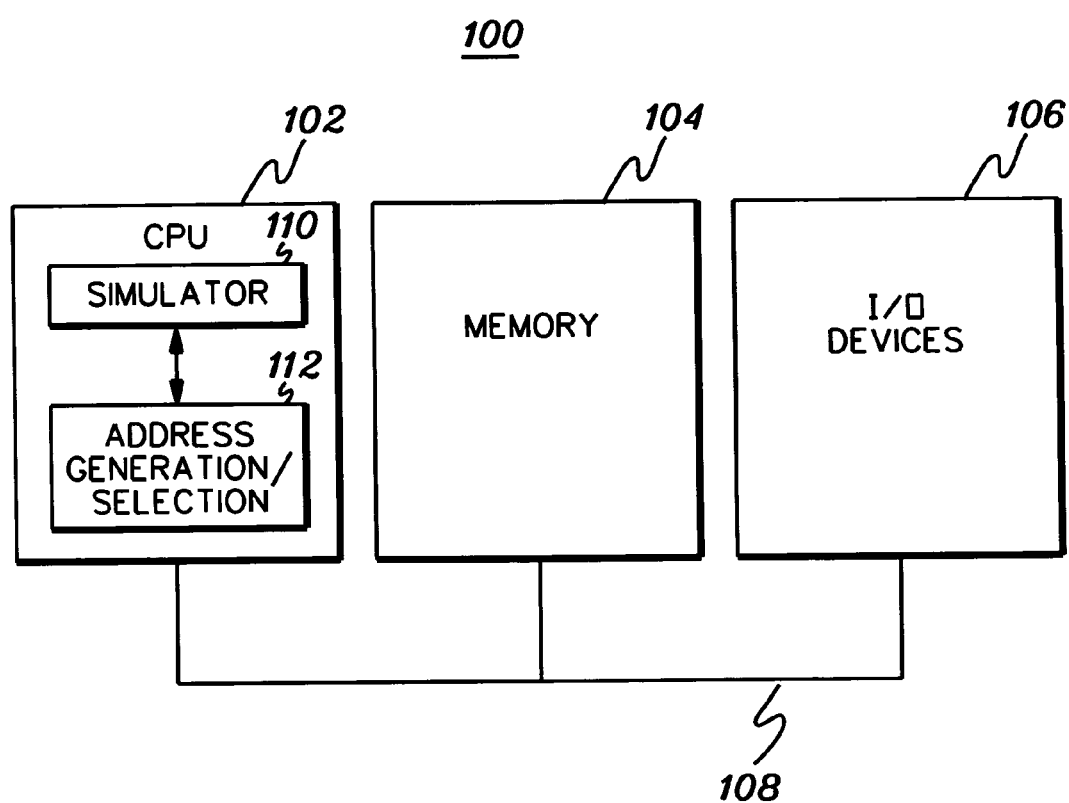
FIG. 1 depicts one embodiment of a computing environment to incorporate and use one or more aspects of the present invention.

One embodiment of a computing environment to incorporate and use one or more aspects of the present invention is described with reference to FIG. 1. In this particular example, a computing environment 100 is based on the UNIX architecture and includes, for instance, an eServer pSeries, offered by International Business Machines Corporation, Armonk, N.Y. Computing environment 100 includes a central processing unit (CPU) 102, a memory 104 (e.g., main memory) and one or more input/output (I/O) devices 106 coupled to one another via, for example, one or more buses 108.

Central processing unit 102 executes an operating system, such as AIX, offered by International Business Machines Corporation, Armonk, N.Y. Further, in one example, central processing unit 102 executes a simulator 110 used to verify components under test. The simulator emulates a particular component being verified allowing test scenarios to be applied against the emulated component to stress the component and obtain the results. There are various types of simulators that can be used for verification, including, for instance, high level design simulators or cycle simulators. One example of a cycle simulator is ZFS employed by International Business Machines Corporation, Armonk, N.Y.

Central processing unit 102 also executes, in accordance with an aspect of the present invention, logic 112 used to generate and select addresses to be employed in verifying components under test (e.g., simulated components). As one example, the generated and selected addresses are provided to the simulator for use by the simulator in verifying emulated components. Further, information may be provided by the simulator to the logic indicating, for instance, the name of the component being tested.

Address generation/selection logic 112 provides a tight coupling between address generation and address selection to ensure that one or more types of addresses desired to verify a component are generated and then selected for use. As one example, the addresses to be generated are based on criteria that will ultimately be used to select an address. In order to facilitate this tight coupling, various data structures are defined using, for instance, C++. Examples of these structures are described prior to describing the logic.

Figure 2:
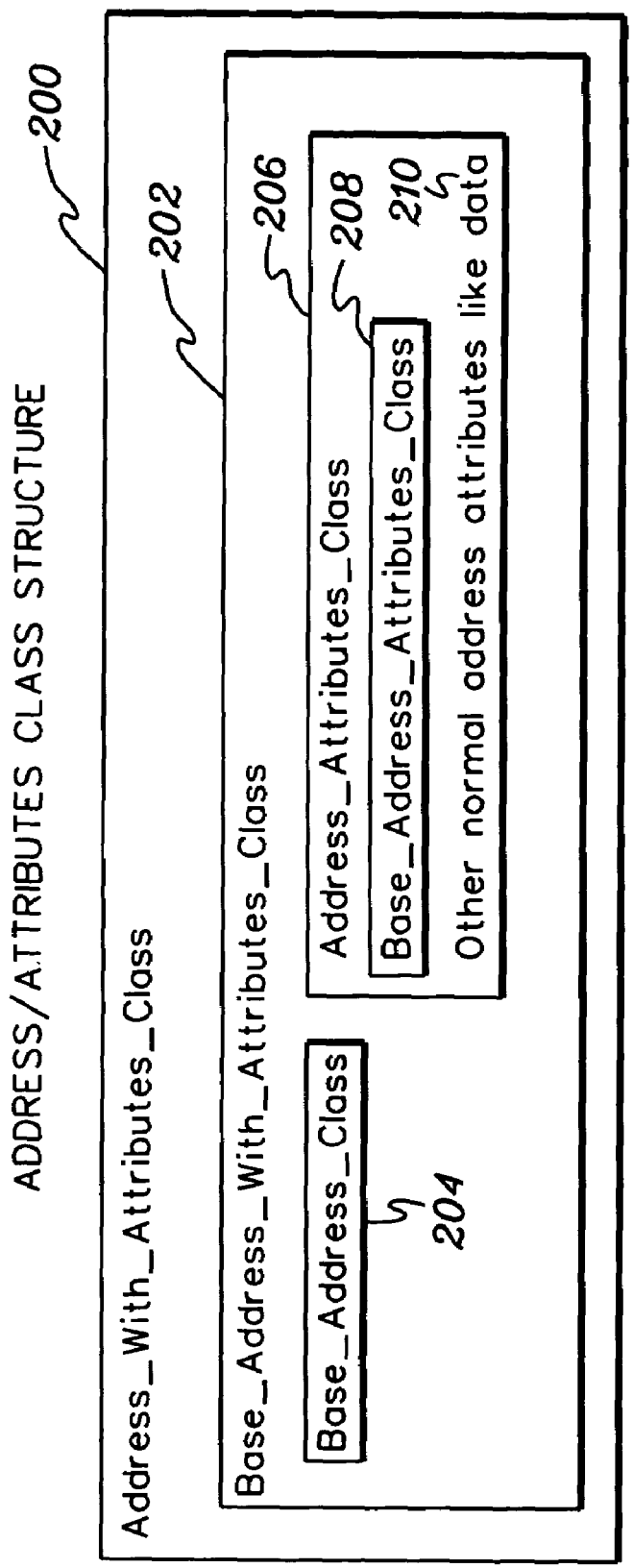
FIG. 2 depicts one example of an address/attributes class structure employed in accordance with an aspect of the present invention.

One structure that is created is the address/attributes class structure depicted in FIG. 2. An address with attributes class 200 includes a base address with attributes class 202 having a base address class 204 and an address attributes class 206. Base address class 204 includes a generated address, and address attributes class 206 includes one or more attributes for the address. As one example, address attributes class 206 includes a base address attributes class 208 designating user specified attributes to be associated with the address, such as data patterns of interest (e.g., a lock byte being zero or non-zero); type of address (e.g., absolute, virtual, guest, host, etc.); location of address; indication of an address being updated; a private indicator specifying who (e.g., component, function) can use the address; store queue indicators; line lock indicators; other indicators; etc., and other address attributes 210, such as data, directory state information, etc. Any information associated with an address can be designated as an attribute. If an attribute is user defined, then it is included in the user specified attributes. Attributes can be forced on, off or randomized.

Figure 3:
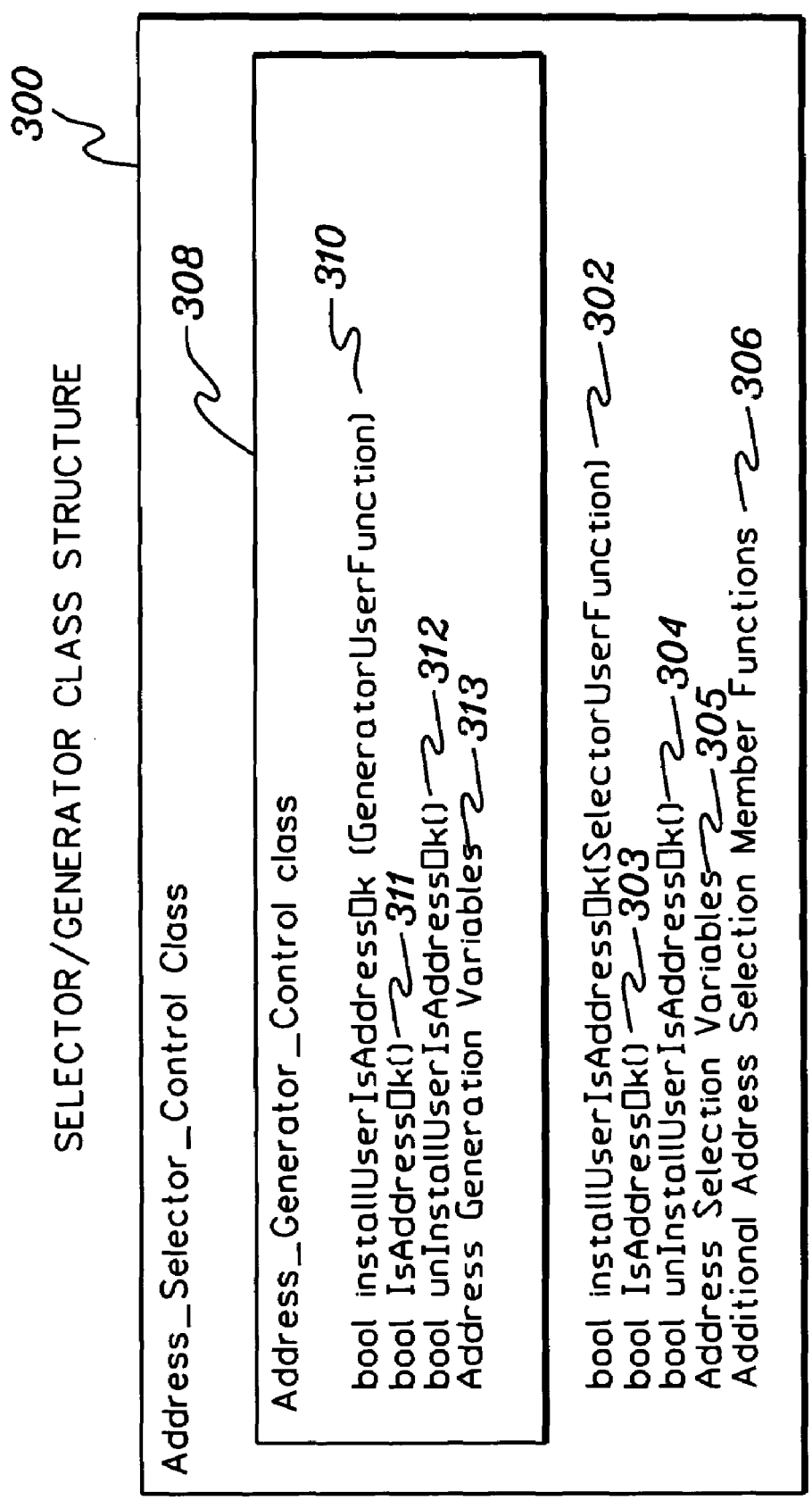
FIG. 3 depicts one example of a selector/generator class structure used in accordance with an aspect of the present invention.

Another class structure that is created is the selector/generator class structure, one example of which is described with reference to FIG. 3. An address selector control class 300 includes, for instance, a selector user function 302 employed to install a function 303 used to test the acceptability of a selected address, and a function 304 to uninstall function 303, when that function is no longer desired. It also includes one or more address selection variables 305 including, for instance, one or more address constraints, such as a designated range, and/or one or more address attributes, etc. It further includes zero or more additional address selection member functions 306. These member functions may include user defined functions that enable addresses to be filtered based on various information associated with the address, address attributes, and/or information that exists in the simulation environment.

Address selector control class 300 also includes an address generator control class 308. This control class includes a generator user function 310 employed to install a function 311 used to test the acceptability of a generated address, as well as a function 312 to uninstall function 311, when the function is no longer desired. Generator user function 310 also provides additional generation functions that may be more complex and not easily described in the class structure. For example, they may include constraints, behaviors, attributes and/or relationships thereof that are implemented via the functions and registered with the class. Address selector control class 300 further includes one or more address generation variables 313 including, for instance, address attributes, address constraints, etc.

Figure 4:
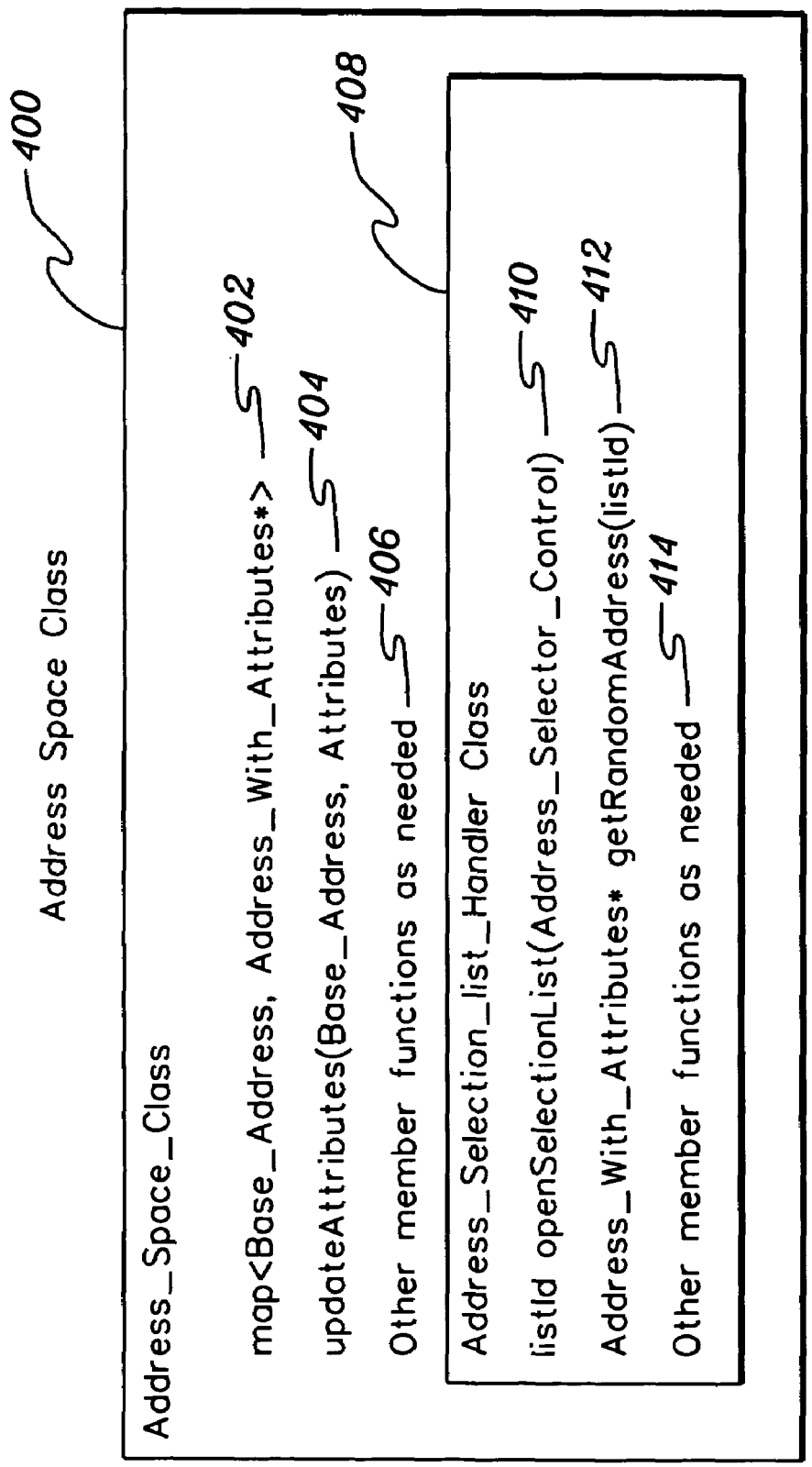
FIG. 4 depicts one example of an address space class employed in accordance with an aspect of the present invention.

Another class structure that is created is an address space class, one example of which is depicted in FIG. 4. An address space class 400 includes a mapping 402 of an address and its associated attributes; an update function 404 that allows the mapping to be updated; and zero or more other member functions 406, as desired.

Address space class 400 also includes an address selection list handler class 408 having, for instance, an address selector control function 410 used to create a list of addresses that includes one or more of the generated addresses that satisfy a selector filter. It also includes an address with attributes function 412 used to select an address from the list. Further, address selection list handler class 408 may also include zero or more member functions 414, as needed or desired.

To create the different class structures and to further prepare for address generation and selection, various steps are performed as described below. The steps have been organized into three categories including address generation, address selection and address space. The steps associated with preparing for address generation are described with reference to FIG. 5, while the steps associated with preparing for address selection are described with reference to FIG. 6. Thereafter, creation of the address space is described.

Figure 5:
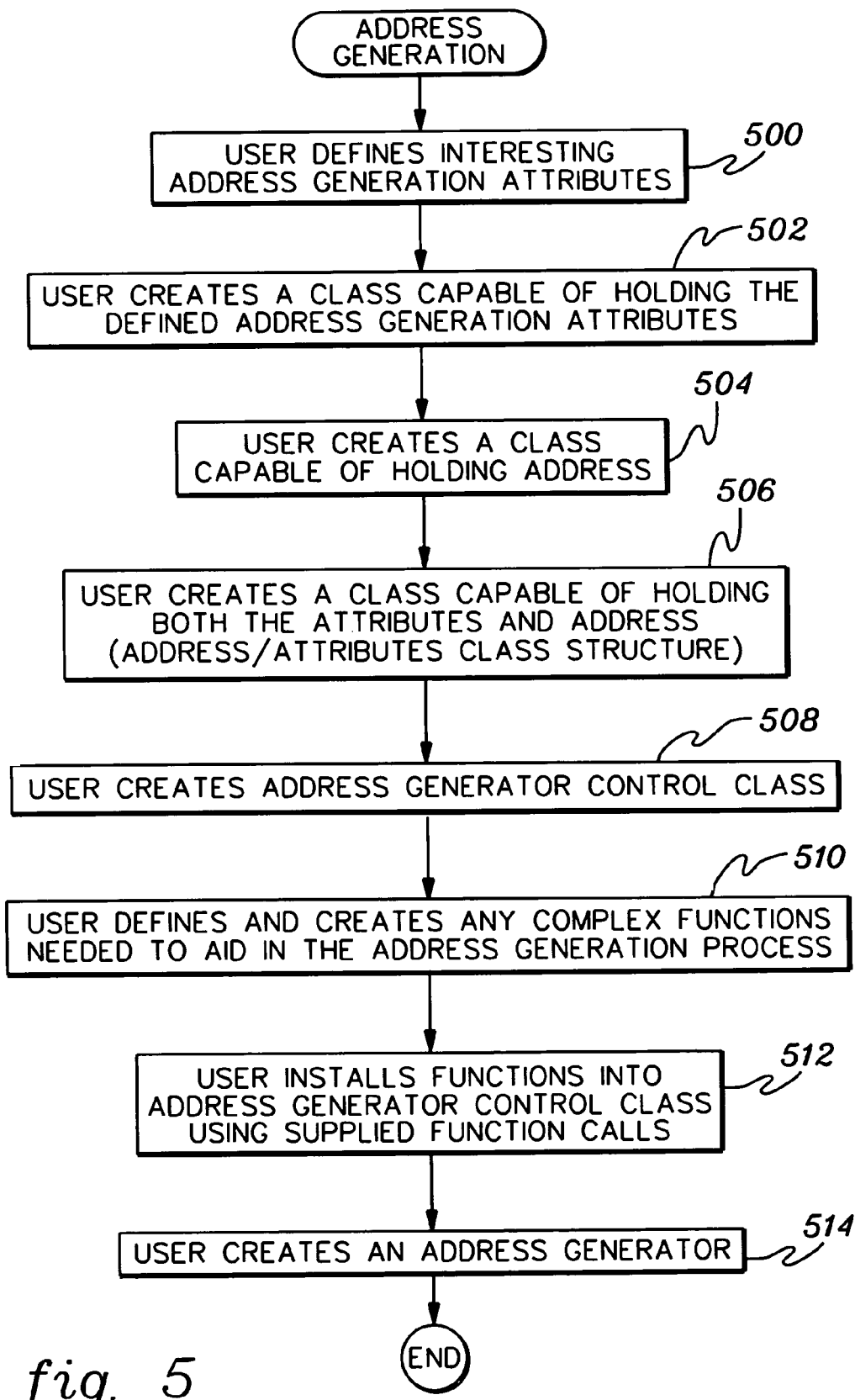
FIG. 5 depicts one embodiment of the logic associated with preparing for address generation, in accordance with an aspect of the present invention.

Referring to FIG. 5, initially, a user defines one or more address generation attributes that are interesting to the user, STEP 500. There can be many types of attributes assigned to an address. Any number of attributes can exist and can be combined in many ways along with address values, data, and other information saved with the address.

Subsequent to defining the attributes, the user creates a class capable of holding the defined address generation attributes (e.g., address attributes class 206), STEP 502. The user also creates a class capable of holding an address (e.g., base address class 204), STEP 504, and a class capable of holding both the attributes and the address (e.g., base address with attributes class 202), STEP 506.

Additionally, the user creates a class capable of installing any defined user address generation functions, plus any other functions which may be helpful during address generation (e.g., address generator control class 308), STEP 508. The user also defines and creates any complex functions needed or desired to aid in the address generation process, STEP 510. Thereafter, the user installs the complex functions into the address generator control class using supplied function calls, STEP 512.

Moreover, the user creates an address generator, which is part of a general address generator class, STEP 514. The generator creates an address based on the address generator control class and adds the address/attributes to a common address space class (see FIG. 4). As one example, the address generator may include a random number generator that creates an address to which attributes may be associated. This completes the steps associated with preparing for address generation.

Figure 6:
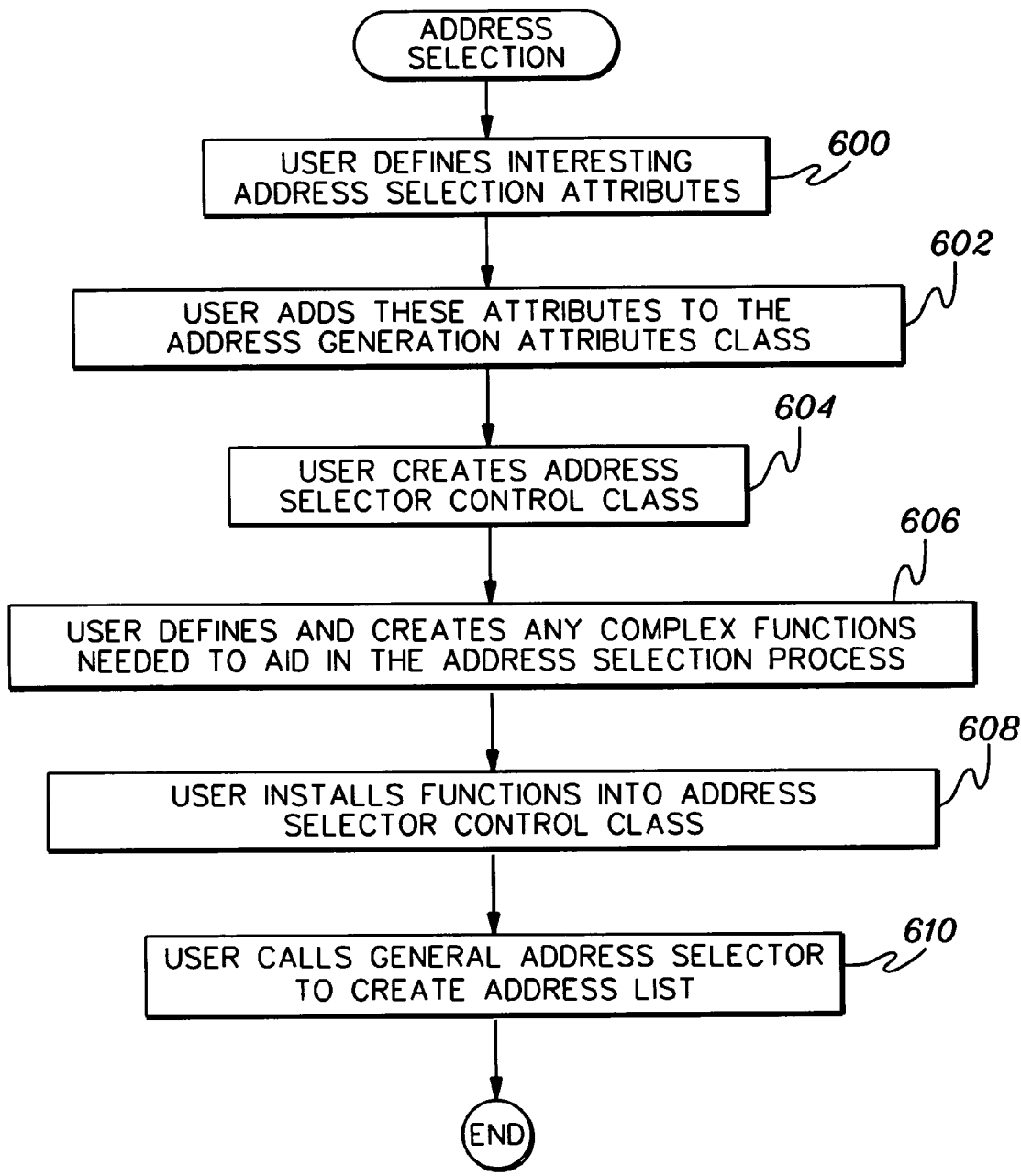
FIG. 6 depicts one embodiment of the logic associated with preparing for address selection, in accordance with an aspect of the present invention.

In addition to preparing for address generation, steps are also taken to prepare for address selection, as described with reference to FIG. 6. Initially, the user defines address selection attributes that are interesting to the user, STEP 600. In one example, at least a portion of the selection attributes correspond to generation attributes to provide a tight coupling between address generation and address selection. The user adds any missing attributes to the address attributes class, described above, STEP 602.

The user also creates a class capable of installing any defined user address selection functions, plus any other functions which may be helpful during address selection, STEP 604. This class is referred to as the address selector control class and it inherits from the address generator control class.

Moreover, the user defines and creates any complex functions needed or desired to aid in the address selection process, STEP 606. The user then installs the defined functions into the address selector control class using supplied function calls, STEP 608.

The user calls a general address selector to create an address list, STEP 610. The general address selector makes a copy of the selector control, which the general address space uses to maintain the address list. The general address space is capable of holding one or more selector controls. Each general address selector is capable of maintaining one or more address lists. This concludes the steps associated with preparing for address selection.

In addition to creating the address/attribute class structure and the selector/generator class structure, as well as an address generator and address selector, an address space class is also created. This class is to hold the address/attribute class structure and is to supply methods for updating the address attributes in the address attributes class. This class is also able to use a selector to provide the user with a list of addresses which match the selector, and to update the address list, if any dependent address attribute changes state.

Subsequent to defining and creating the various class structures, and the generator and the selector, the user is able to open an address list based on a given address selector. By having the address generator and address selector use a common set of address attributes, there is a tight coupling of the address generator/selector mechanism. This enables the achievement of better verification results.

Figure 7:
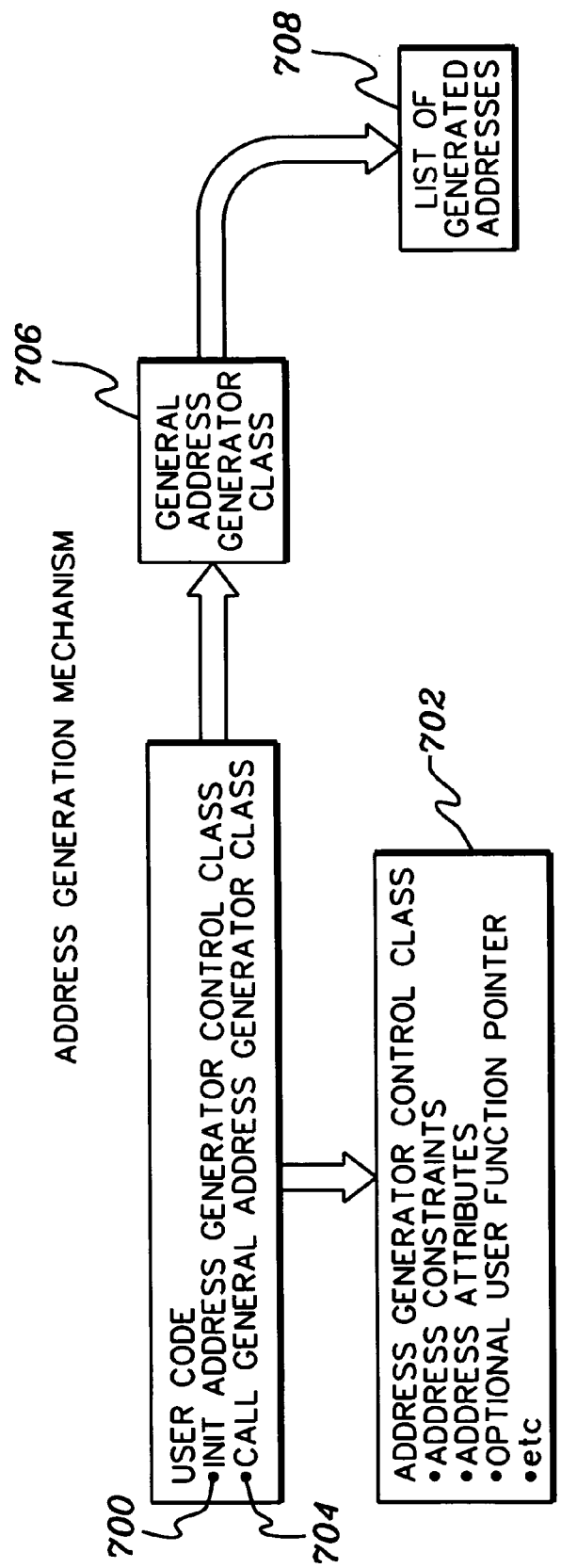
FIG. 7 depicts one embodiment of an overview of address generation, in accordance with an aspect of the present invention.

Following the preparation stage, addresses may be generated and then selected. An overview of the logic associated with generating addresses is described with reference to FIG. 7. Initially, the address generator control class is initialized 700. As one example, it is initialized with desired constraints, attributes, data and other fields, as shown at 702. At least some of this information is retrieved from the base address with attributes class 202 (FIG. 2). Further, since some constraints and behaviors are not easily described in this class structure, they are implemented by describing the relationship via a function. The function, if defined, is registered with the generator class and a pointer to the function is included in the address generator control class, as shown at 702 (FIG. 7). There may be zero or more of these user functions.

The generator control class, once initialized with the desired information, is then passed 704 to a general address generator class 706. For example, the general address generator class is called by the user code. General address generator class 706 generates a list of addresses 708 with values, attributes and data that meet the constraint criteria. This list of generated addresses is usually made available as a single set of addresses to all of the requesters, although it need not be.

Figure 8:
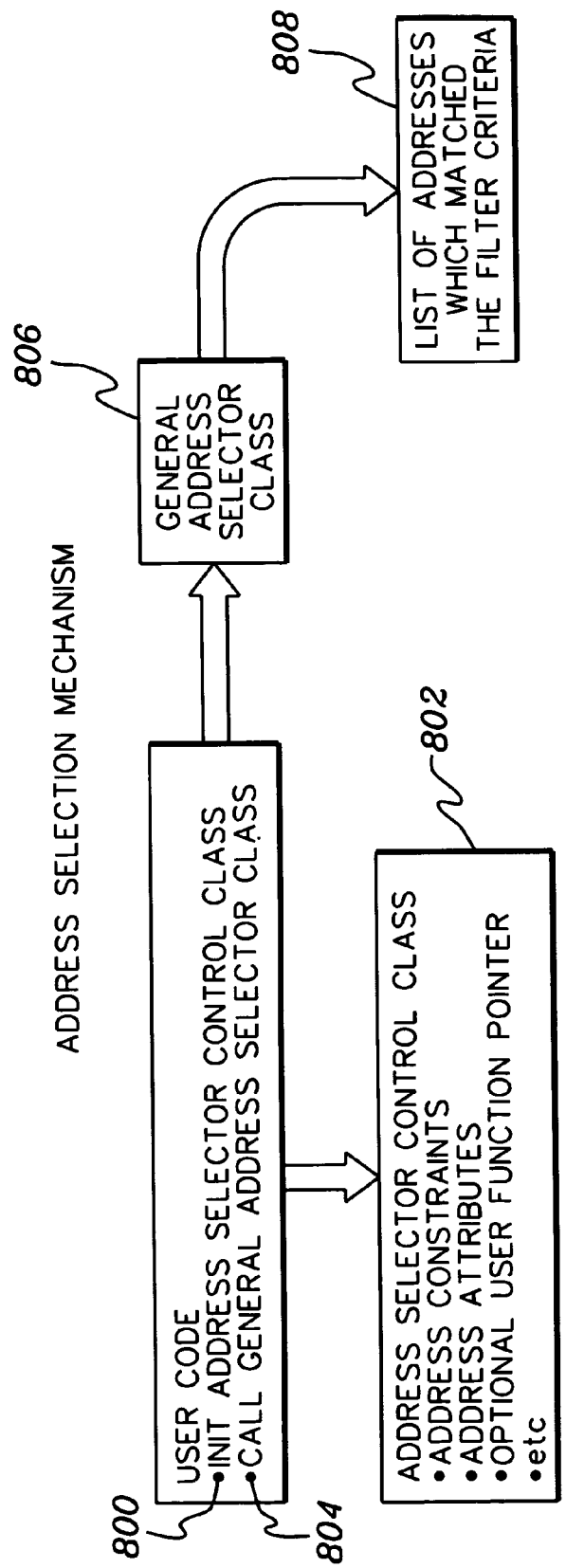
FIG. 8 depicts one embodiment of an overview of address selection, in accordance with an aspect of the present invention.

The list of generated addresses is then selected from to obtain one or more addresses that meet a selected criteria. An overview associated with address selection is described with reference to FIG. 8. An address selector control class used as a filter input to select a subset of addresses from a list of generated addresses is initialized 800. As one example, it is initialized with desired constraints, attributes, etc., as well as with zero or more pointers to zero or more optional user functions, as shown at 802. At least some of the information is retrieved from the base address with attributes class. The addresses can be filtered based on the value of the addresses or the address attributes. Furthermore, through the use of custom user defined functions, addresses can be filtered based on other information associated with the address or information which exists in the simulation environment.

The selector control class, once initialized, is passed 804 to a general address selector class 806. For example, the general address selector class is called by user code. General address selector class 806 uses one or more filters to select addresses from the list of generated addresses that match the filtered criteria. The one or more addresses that match are placed in a list 808.

The generated address list has two main usage forms. The first form is the public permanent list which is created at some point and used repeatedly during the test case to select addresses which meet the filter criteria. The same public address list can be referenced by more than one requestor (e.g., the one to apply the addresses to the component under test, such as a CPU), if the filter criteria matches exactly. A permanent address list is generally public and the filters used to generate it do not change. Thus, two permanent lists with the same filters will be identical, so that they can be easily shared. The second form is a private temporary list which is generally used to visit all of the addresses that meet the filter criteria once, in random or sequential order. The list is usually destroyed with use as each address is removed after it is visited. The temporary list tends to be private as the intention of usage is to visit each address in the list and remove it along the way leaving an empty list. A temporary list can be public to allow multiple requesters to visit each address once across their combined actions. Since permanent lists are used over time and the attributes and data associated with the addresses may change, these lists may be updated and/or invalidated. Temporary lists are not usually updated.

Invalidating lists and having to constantly regenerate them by applying the filter to the source list can be time consuming depending on the size of the source list. Thus, in one aspect of the present invention, the list is updated when attribute information for an address changes states. Built-in filter functions which use the address attributes automatically identify the address attributes which would trigger an update. User filter functions which are based on address attributes can register a subset of the attributes which would trigger an update. Attributes updates are directed through the main address list which manages the subset address lists created with filters so that the subset lists can be updated when needed due to address attributes changing.

Figure 9:
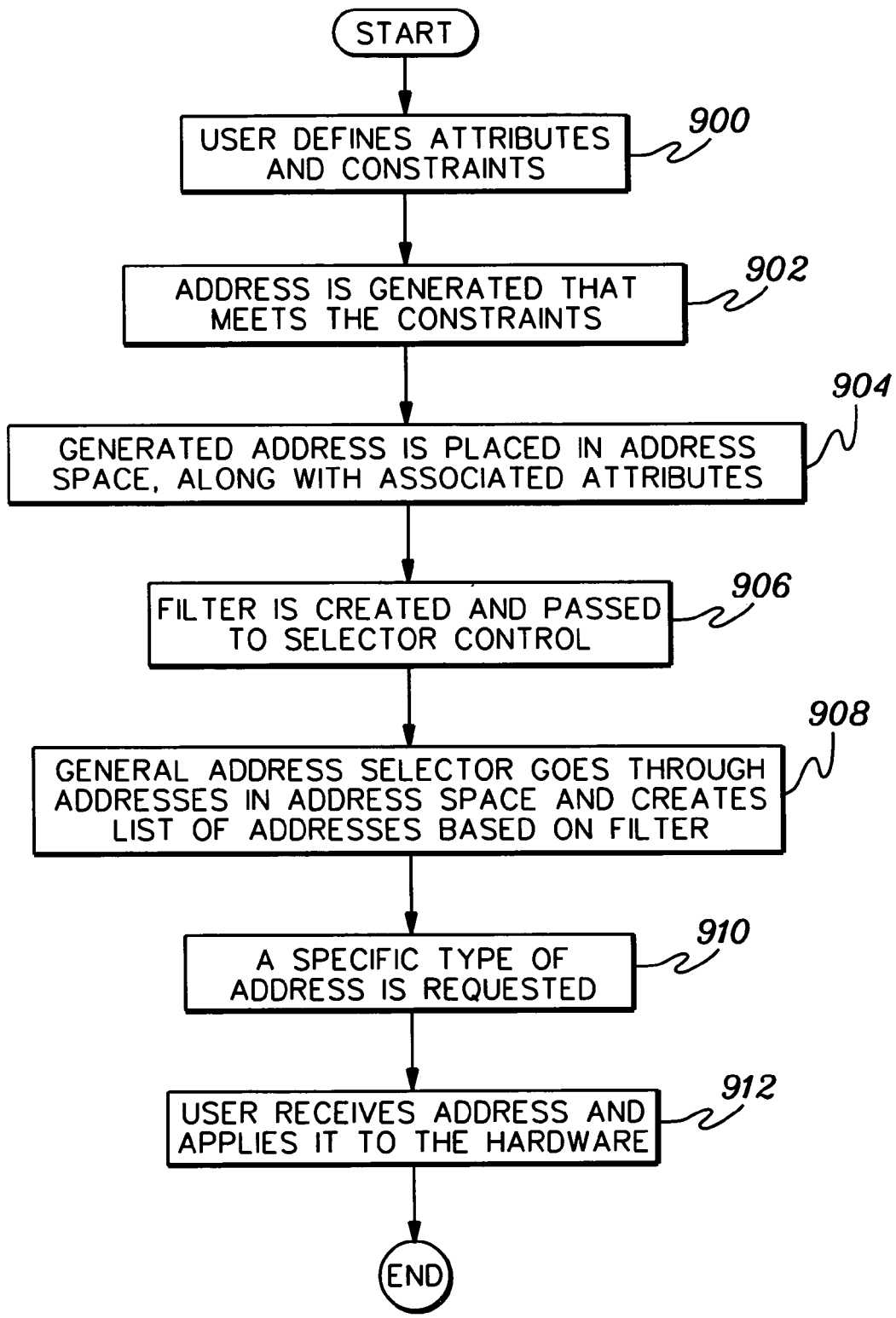
FIG. 9 depicts one embodiment of the logic associated with generating and selecting an address, in accordance with an aspect of the present invention.
Figure 10:
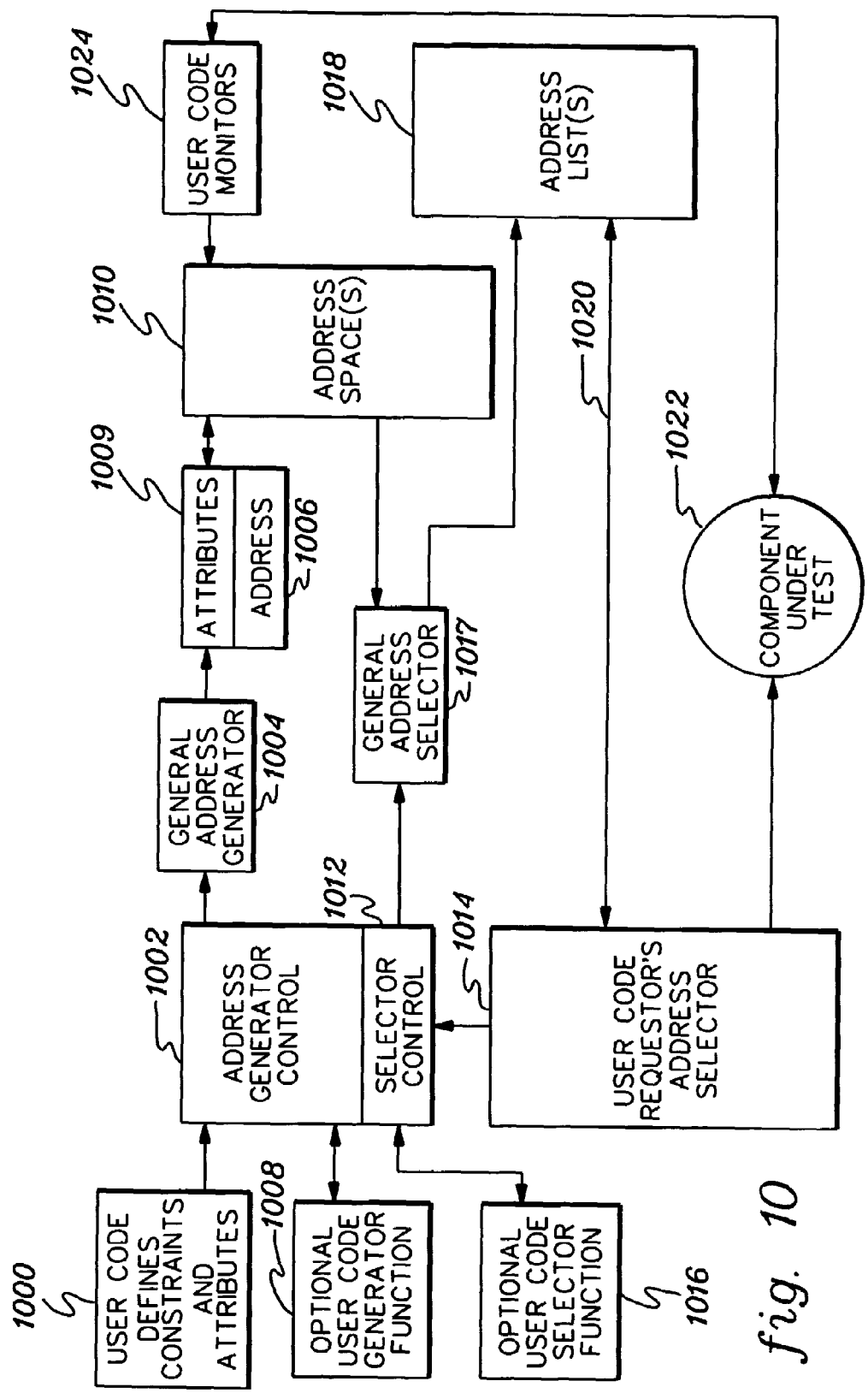
FIG. 10 depicts a pictorial overview of address generation and selection, in accordance with an aspect of the present invention.

Further details regarding the generation and selection of addresses, in accordance with an aspect of the present invention, are described with reference to FIGS. 9 and 10. In particular, FIG. 9 describes one embodiment of the logic associated with generating and selecting addresses, and FIG. 10 depicts a pictorial overview of the process. Both figures are referenced in the following discussion. Reference numerals beginning with 9 can be found in FIG. 9 and those beginning with 10 can be found in FIG. 10.

Initially, a user defines one or more constraints and/or one or more attributes to be used to generate an address, STEPS 900 (FIG. 9) and 1000 (FIG. 10). The constraints specify certain requirements, such as an address is to be within a specific range. The attributes define characteristics of or associated with the address, as described above. The user defined constraints and/or attributes are passed to an address generator control 1002.

An address is then generated that meets the constraints, STEP 902. For example, general address generator 1004 is used to generate an address 1006 that meets the constraints specified in address generator control 1002. Control 1002 may also call one or more optional user code generator functions 1008 in order to apply one or more complex user constraints to the address generation logic. The address generator uses the constraints and the zero or more functions to create the address.

Assigned to the address are one or more attributes 1009, which are obtained from address generator control 1002.

The generated address is then placed in address space 1010, along with the associated attributes, STEP 904. For example, as each address is generated, the mapping function of the address space class maps one or more defined attributes to the address, and places the address along with its attributes in a list in the address space. This list behaves, in one example, as a database in that queries may be selected thereon. In one example, one list is provided; however, in other examples, a plurality of lists may be provided.

Additionally, a filter is created and passed to a selector control 1012, STEP 906. For instance, a user code requestor's address selector 1014 creates a filter based on user defined selection attributes and passes the filter to selector control 1012. The selector control may optionally call one or more user functions 1016 to provide more complex selection criteria. The selector control is input to a general address selector 1017 that parses the addresses in the address space and creates a list of addresses 1018 based on the filter, STEP 908. Thus, list 1018 includes the one or more addresses that meet the selected criteria.

Thereafter, a requestor may request a specific type of address, STEP 910. For example, user code requestor's address selector 1014 of the simulated environment requests 1020 an address from address list 1018. The requestor receives the requested address, STEP 912, and applies it to a component under test 1022.

Component under test 1022 is monitored by user code monitors 1024 to ensure the component is operating properly. Further, the user code monitors detect when one or more of the attributes have changed, which triggers the general address selectors to run the filters that may be affected by the change causing one or more addresses to be added to and/or deleted from list 1018. For example, monitors 1024 communicate one or more changes to address space 1010. Address space 1010 informs general address space selector 1017 via a function call causing selector 1017 to rerun one or more filters resulting in one or more changes to address list(s) 1018.

Described in detail above is a capability for facilitating the generation and selection of addresses to be used in a verification environment. The generation and selection is tightly coupled to ensure that desired addresses to be selected have been generated. This enhances the verification process by ensuring that addresses that can stress a particular component have been generated, and thus, can be selected.

By using address attributes, addresses which are shared among multiple requesters and can result in address conflicts can be denoted, as well as addresses which are reserved for a subset of requestors or for a particular requestor which is often valuable during the early life of the design cycle when the address conflict logic may not be present or working properly. Addresses that are to be fetched from a particular location or marked as having been updated or both can be identified by using attributes.

Advantageously, a capability is described herein for assigning attributes to an address. The attributes include user attributes and/or other attribute information, such as data, directory state information, storage protection keys, etc. The capability provides a uniform mechanism for assigning and relating attributes to addresses in the verification environment. Furthermore, a user can easily sort and group the addresses into lists based on the attributes. This ability allows the user to focus on various specific address attributes in the verification process.

Attributes can be forced on, off, or randomized. A particular address can have bits forced on, off, or randomized, as well as having its value constrained within a specified address range or ranges. The attribute information for generation can be extended to contain any information associated with an address. For example, some addresses may contain data in which the data may have patterns of interest, like lock bytes being zero or non-zero. In cases where it is impractical to represent information related to the address of an attribute, an extension is provided which enables a custom user defined filter to be written in code. Sets of addresses are stored in address lists. These address lists are constructed based on address attributes plus the optional custom user defined filter. Class functions are supplied for finding particular addresses or selecting random addresses among other things.

The generated and selected addresses can be provided to one or more requestors for use in a verification environment to stress a particular component under test. For instance, if the component under test is memory, addresses may be provided to one or more CPUs to test, for instance, cache coherency.

Addresses can be selected at runtime (e.g., when a job is running) by using an input file that is input to the address selector. The input file specifies the filter to be used. Further, attributes can be defined at runtime by using an input file that is input to the user code defines constraints and attributes.

Although an example of an environment to incorporate and use one or more aspects of the present invention has been described, there may be many variations without departing from the spirit of the present invention. For example, other types of environments can benefit from one or more aspects of the present invention. Further, other architectures, operating systems, simulators etc. may be used without departing from the spirit of the present invention. Additionally, many types of attributes and constraints may be used. Those provided herein are only examples.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of providing addresses to be used in a verification environment, said method comprising:
   generating addresses having one or more attributes associated therewith, wherein the generating of at least one address of the generated addresses is based on at least one selection attribute to be used in selecting at least one address of the generated addresses;
   employing a lookup table to filter the generated addresses with the one or more attributes into a saved list of addresses of particular type, the list of addresses of particular type comprising at least one address; and
   selecting at least one address from the list of addresses of particular type to be forwarded to a component under test in a verification environment, the selecting employing a filter specifying the at least one selection attribute that corresponds to at least one attribute of the one or more attributes, wherein said generating, said employing and said selecting are controlled to ensure at least one address is selected that satisfies the filter.

2. The method of claim 1, wherein the list of addresses of particular type is a single list of the one or more addresses, and the single list is searchable based on attributes, and wherein the lookup table is an address space class structure.

3. The method of claim 2, wherein the single list is subdividable into one or more groups based on attributes.

4. The method of claim 1, further comprising defining by a user one or more attributes and constraints to be employed by the generating, and wherein the generating of at least one address of the generated addresses is based on one or more user defined constraints.

5. The method of claim 1, wherein the generating of at least one address of the generated addresses comprises employing a user defined generator function.

6. The method of claim 1, further comprising defining by a user the one or more attributes associated with the generated addresses.

7. The method of claim 1, wherein the one or more attributes and the at least one selection attribute specified in the filter are maintained in a same class.

8. The method of claim 1, wherein the selecting comprises further employing a user defined selector function to select at least one address.

9. The method of claim 1, wherein at least one attribute of the one or more attributes enables one or more generated addresses having the at least one attribute to be assigned to a particular requestor.

10. The method of claim 1, further comprising dynamically changing the list of addresses of particular type, in response to a change to one or more attributes of the generated addresses.

11. A system of providing addresses to be used in a verification environment, said system comprising:
    means for generating addresses having one or more attributes associated therewith, wherein the generating of at least one address of the generated addresses is based on at least one selection attribute to be used in selecting at least one address of the generated addresses;
    means for employing a lookup table to filter the generated addresses with the one or more attributes into a saved list of addresses of particular type, the list of addresses of particular type comprising at least one address; and
    means for selecting at least one address from the list of addresses of particular type to be forwarded to a component under test in a verification environment, the means for selecting employing a filter specifying the at least one selection attribute that corresponds to at least one attribute of the one or more attributes, and wherein the generating, the employing and the selecting are controlled to ensure at least one address is selected that satisfies the filter.

12. The system of claim 11, wherein the list of addresses of particular type is a single list of the one or more addresses, and the single list is searchable based on attributes, and wherein the lookup table is an address space class structure.

13. The system of claim 12, wherein the single list is subdividable into one or more groups based on attributes.

14. The system of claim 11, further comprising means for defining by a user one or more attributes and constraints to be employed by the generating, and wherein the generating of at least one address of the generated addresses is based on one or more user defined constraints.

15. The system of claim 11, wherein the means for generating of at least one address of the generated addresses comprises means for employing a user defined generator function.

16. The system of claim 11, further comprising means for defining by a user the one or more attributes associated with the generated addresses.

17. The system of claim 11, wherein the one or more attributes and the at least one selection attribute specified in the filter are maintained in a same class.

18. The system of claim 11, wherein the means for selecting further comprises means for employing a user defined selector function to select at least one address.

19. The system of claim 11, wherein at least one attribute of the one or more attributes enables one or more generated addresses having the at least one attribute to be assigned to a particular requestor.

20. The system of claim 11, further comprising means for dynamically changing the list of addresses of particular type, in response to a change to one or more attributes of the generated addresses.

21. A system of providing addresses to be used in a verification environment, said system comprising:
- a generator adapted to generate addresses having one or more attributes associated therewith, wherein the generating of at least one address of the generated addresses is based on at least one selection attribute to be used in selecting at least one address of the generated addresses;
- a lookup table adapted to filter the generated addresses with the one or more attributes into a saved list of addresses of particular type, the list of addresses of particular type comprising at least one address; and
- a selector adapted to select at least one address from the list of addresses of particular type to be forwarded to a component under test in a verification environment, the selector employing a filter specifying the at least one selection attribute that corresponds to at least one attribute of the one or more attributes, wherein said generating, said filtering and said selecting are controlled to ensure at least one address is selected that satisfies the filter.

22. An article of manufacture comprising:
- at least one computer readable storage medium having computer readable program code logic to provide addresses to be used in a verification environment, the computer readable program code logic comprising:
  - generate logic to generate addresses having one or more attributes associated therewith, wherein the generating of at least one address of the generated addresses is based on at least one selection attribute to be used in selecting at least one address of the generated addresses;
  - filter logic employing a lookup table to filter the generated addresses with the one or more attributes into a saved list of addresses of particular type, the list of addresses of particular type comprising at least one address; and
  - select logic to select at least one address from the list of addresses of particular type to be forwarded to a component under test in a verification environment, the select logic employing a filter specifying the at least one selection attribute that corresponds to at least one attribute of the one or more attributes, and wherein the generating, the employing and the selecting are controlled to ensure at least one address is selected that satisfies the filter.

23. The article of manufacture of claim 22, wherein the list of addresses of particular type is a single list of the one or more addresses, and the single list is searchable based on attributes, and wherein the lookup table is an address space class structure.

24. The article of manufacture of claim 23, wherein the single list is subdividable into one or more groups based on attributes.

25. The article of manufacture of claim 22, further comprising defining by a user one or more attributes and constraints to be employed by the generate logic, and wherein the generating of at least one address of the generated addresses is based on one or more user defined constraints.

26. The article of manufacture of claim 22, wherein the generating of at least one address of the generated addresses comprises employ logic to employ a user defined generator function.

27. The article of manufacture of claim 22, further comprising define logic to define by a user the one or more attributes associated with the generated addresses.

28. The article of manufacture of claim 22, wherein the one or more attributes and the at least one selection attribute specified in the filter are maintained in a same class.

29. The article of manufacture of claim 22, wherein the select logic further comprises employ logic to employ a user defined selector function to select at least one address.

30. The article of manufacture of claim 22, wherein at least one attribute of the one or more attributes enables one or more generated addresses having the at least one attribute to be assigned to a particular requestor.

31. The article of manufacture of claim 22, further comprising change logic to dynamically change the list of addresses of particular type, in response to a change to one or more attributes of the generated addresses.

* * * * *